United States Patent
Ma et al.

(10) Patent No.: US 12,364,022 B2
(45) Date of Patent: Jul. 15, 2025

(54) INTEGRATED CIRCUIT

(71) Applicants: TAIWAN SEMICONDUCTOR MANUFACTURING CO., LTD., Hsinchu (TW); TSMC CHINA COMPANY LIMITED, Shanghai (CN)

(72) Inventors: Ya-Qi Ma, Shanghai (CN); Lei Pan, Shanghai (CN); Zhen Tang, Shanghai (CN)

(73) Assignees: TAIWAN SEMICONDUCTOR MANUFACTURING CO., LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 206 days.

(21) Appl. No.: 17/853,703

(22) Filed: Jun. 29, 2022

(65) Prior Publication Data

US 2022/0336443 A1  Oct. 20, 2022

Related U.S. Application Data

(62) Division of application No. 16/807,003, filed on Mar. 2, 2020, now Pat. No. 11,380,671.

(30) Foreign Application Priority Data

Feb. 2, 2020  (CN) .......................... 202010078071.9

(51) Int. Cl.
  *H10D 89/60*  (2025.01)
  *H10D 84/40*  (2025.01)

(52) U.S. Cl.
  CPC .......... *H10D 89/811* (2025.01); *H10D 84/40* (2025.01); *H10D 89/921* (2025.01)

(58) Field of Classification Search
  None
  See application file for complete search history.

(56) References Cited

U.S. PATENT DOCUMENTS

| | | | |
|---|---|---|---|
| 5,733,794 | A | 3/1998 | Gilbert et al. |
| 6,004,838 | A | 12/1999 | Ma |

(Continued)

FOREIGN PATENT DOCUMENTS

| | | | |
|---|---|---|---|
| CN | 106876380 A | | 6/2017 |
| CN | 109149544 A | | 1/2019 |

(Continued)

*Primary Examiner* — Steven M Page
(74) *Attorney, Agent, or Firm* — Maschoff Brennan

(57) ABSTRACT

A method is provided and includes the operation below: discharging electrostatic charges from a pad to a first voltage terminal through a first active region coupled to the pad and a second active region coupled between the first active region and the first voltage terminal, in which the first active region and the second active region are the same conductivity type and have different widths from each other, and the first active region and the second active region are included in a first transistor having a first breakdown voltage; and discharging the electrostatic charges through an ESD primary circuit having a first terminal coupled with the first active region and a second terminal coupled with the first voltage terminal. The ESD primary circuit has a trigger voltage lower than the first breakdown voltage.

20 Claims, 13 Drawing Sheets

(56) References Cited

U.S. PATENT DOCUMENTS

| | | | |
|---|---|---|---|
| 6,028,758 A | | 2/2000 | Sharpe-Geisler |
| 6,750,515 B2 | | 6/2004 | Ker |
| 7,838,937 B1 | | 11/2010 | Walker et al. |
| 8,841,696 B2 | | 9/2014 | Lee |
| 2002/0140489 A1 | | 10/2002 | Maloney et al. |
| 2003/0146474 A1 | * | 8/2003 | Ker .................. H01L 27/1203 |
| | | | 257/349 |
| 2003/0227726 A1 | | 12/2003 | Chen |
| 2007/0081282 A1 | | 4/2007 | Li |
| 2013/0093508 A1 | | 4/2013 | Sakamoto et al. |
| 2014/0217461 A1 | | 8/2014 | Song |
| 2016/0179713 A1 | * | 6/2016 | Matsuoka ............. G06F 1/3203 |
| | | | 710/46 |
| 2017/0170165 A1 | | 6/2017 | Chen |
| 2018/0374839 A1 | | 12/2018 | Tsai |
| 2020/0251466 A1 | | 8/2020 | Stockinger |
| 2021/0066287 A1 | | 3/2021 | Tsai |

FOREIGN PATENT DOCUMENTS

| | | |
|---|---|---|
| DE | 69623509 T2 | 5/2003 |
| EP | 0280236 B1 | 5/1994 |
| KR | 1019980058496 A | 10/1998 |
| KR | 1020010058138 A | 7/2001 |
| KR | 1020030053211 A | 6/2003 |
| KR | 100389768 B1 | 3/2004 |
| KR | 1020060115077 A | 11/2006 |
| TW | 201906132 A | 2/2019 |
| WO | 2015037195 A1 | 3/2015 |

\* cited by examiner

600

DISCHARGING ELECTROSTATIC CHARGES FROM A PAD TO A FIRST VOLTAGE TERMINAL THROUGH A FIRST ACTIVE REGION AND A SECOND ACTIVE REGION, WHEREIN THE FIRST ACTIVE REGION AND THE SECOND ACTIVE REGION HAVE DIFFERENT WIDTHS FROM EACH OTHER, AND ARE INCLUDED IN A FIRST TRANSISTOR HAVING A FIRST BREAKDOWN VOLTAGE ~610

DISCHARGING THE ELECTROSTATIC CHARGES THROUGH AN ESD PRIMARY CIRCUIT WHICH HAS A TRIGGER VOLTAGE LOWER THAN THE FIRST BREAKDOWN VOLTAGE ~620

FIG. 6

INTEGRATED CIRCUIT

CROSS REFERENCE

The present is a divisional application of U.S. application Ser. No. 16/807,003, filed Mar. 2, 2020, now U.S. Pat. No. 11,380,671, issued Jul. 5, 2022, which claims priority to China Application Serial Number 202010078071.9 filed on Feb. 2, 2020, which is herein incorporated by reference in its entirety.

BACKGROUND

An ESD event produces extremely high voltages and leads to pulses of high current of a short duration that can damage integrated circuit devices. For the ESD protection design of the integrated circuit devices, two-stage ESD protection circuit, including, for example, an ESD primary circuit and victim devices, has been implemented in the industry. However, before the ESD primary circuit is turned, the victim devices might be destroyed due to the high snapback turn-on voltage the ESD primary circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flow chart of a method of operating an integrated circuit, in accordance with some embodiments.

DETAILED DESCRIPTION

Figure 1:
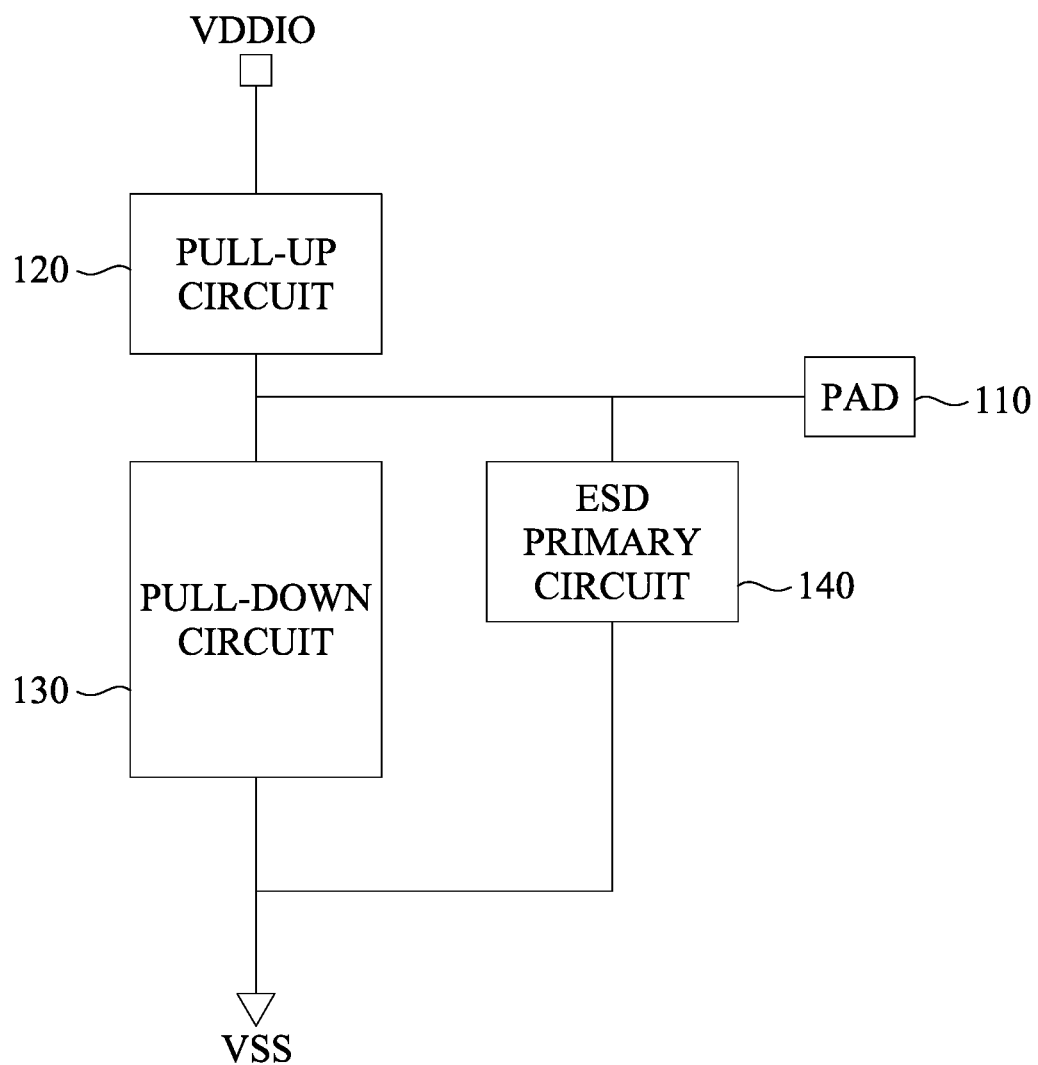
FIG. 1 is a block diagram of part of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is now made to FIG. 1. FIG. 1 is a block diagram of part of an integrated circuit 100, in accordance with various embodiments. For illustration, the integrated circuit 100 includes a pad 110, a pull-up circuit 120, a pull-down circuit 130, and an electrostatic discharge (ESD) primary circuit 140. The pad 110 is coupled to a terminal of the pull-up circuit 120, a terminal of the pull-down circuit 130, and a terminal of the ESD primary circuit 140. Another terminal of the pull-up circuit 120 is coupled to a voltage terminal configured to receive a supply voltage VDDIO (which will also be referred to as the "voltage terminal VDDIO" in the following paragraphs). The terminal of the pull-down circuit 130 is coupled to the terminal of the pull-up circuit 120 and the terminal of the ESD primary circuit 140, and another terminal of the pull-down circuit 130 is coupled to a voltage terminal configured to receive a supply voltage VSS (which will also referred to as the "voltage terminal VSS" in the following paragraphs). The terminal of the ESD primary circuit 140 is coupled to the terminal of the pull-up circuit 120 and the terminal of pull-down circuit 130, and another terminal of the ESD primary circuit 140 is coupled to the another terminal of the pull-down circuit 130 and the voltage terminal VSS. In some embodiments, the integrated circuit 100 provides ESD protection with efficient discharging paths to bypass any ESD stress. For instance, the integrated circuit 100 protects an internal circuit (not shown) being damaged by undesired and unpredictable electrostatic discharge event in the human body model (HBM), the charge device model (CDM), and the machine model (MM). The integrated circuit 100 shown in FIG. 1 is given for illustrative purposes. Various equivalent ESD protection circuit are within the contemplated scope of the present disclosure. For example, in some embodiments, tracker circuits are coupled with the pull-up circuit 120 and/or the pull-down circuit 130 and configured to control the pull-up circuit 120 and the pull-down circuit 130 in normal operation mode.

In some embodiments, during an ESD event, for example, the pull-down circuit 130 clamps a voltage induced by the electrostatic charges in the ESD event, and a portion of the ESD current from the pad 110 shunts through the pull-down circuit 130 to the voltage terminal VSS when the ESD primary circuit 140 is not yet turned on. As the ESD current is increasing, a voltage across two terminal of the ESD primary circuit 140 is increasing and further reaches a trigger voltage configured to turn on the ESD primary circuit 140. Accordingly, the ESD primary circuit 140 is turned on to discharge a portion of the ESD current from the pad 110 to the voltage terminal VSS.

Figure 2A:
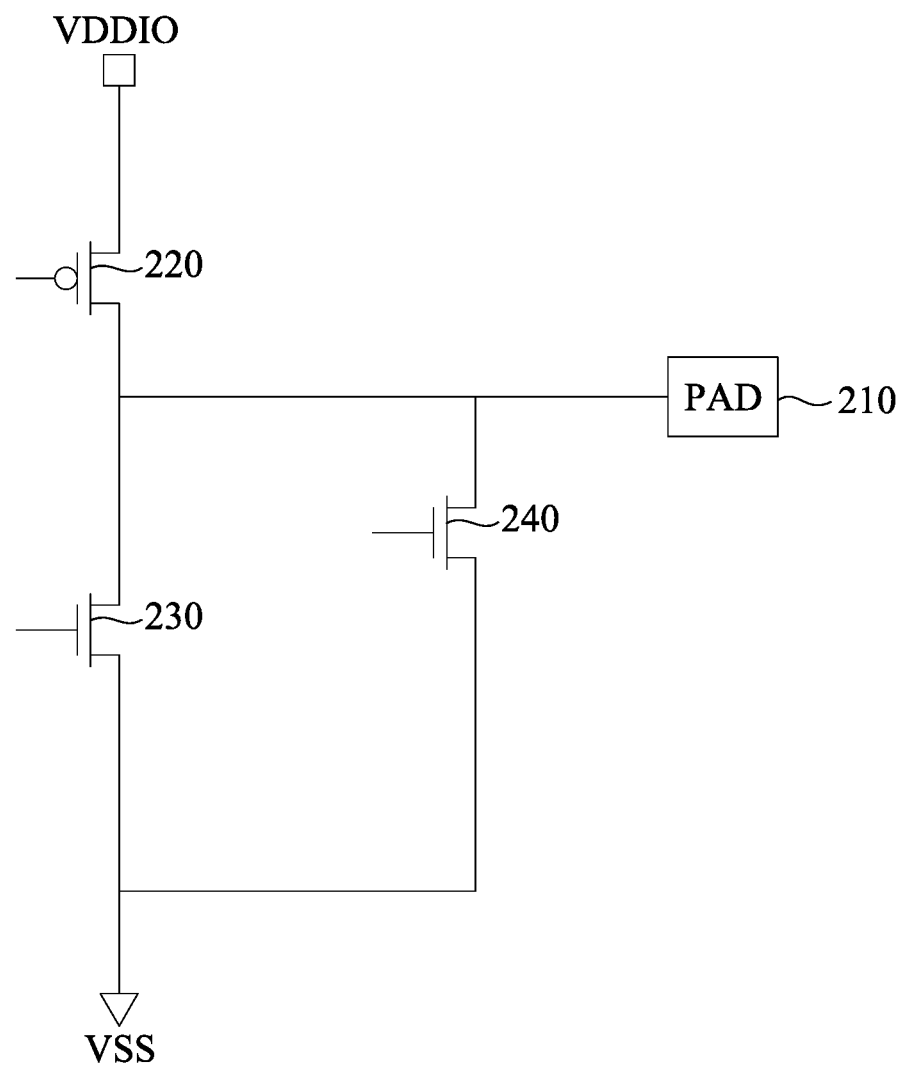
FIG. 2A is an equivalent circuit of part of an integrated circuit corresponding to the integrated circuit of FIG. 1, in accordance with some embodiments.

Reference is now made to FIG. 2A. FIG. 2A is an equivalent circuit of part of an integrated circuit 200 corresponding to the integrated circuit 100 of FIG. 1, in accordance with some embodiments. the integrated circuit 200 includes a pad 210 and transistors 220-240. The pad 210 is configured with respect to, for example, the pad 110 of FIG. 1. The transistor 220 is configured with respect to, for example, the pull-up circuit 120 of FIG. 1. The transistor 230 is configured with respect to, for example, the pull-down circuit 130 of FIG. 1. The transistor 240 is configured with respect to, for example, the ESD primary circuit 140 of FIG. 1. In some embodiments, the transistor 230 is substantially the same as the transistor 240.

For illustration, in some embodiments, a terminal of the transistor 220 is coupled to the voltage terminal VDDIO, and another terminal of the transistor 220 is coupled to the pad 210. A terminal of the transistor 230 is coupled to the pad 210, and another terminal of the transistor 230 is coupled to the voltage terminal VSS. A terminal of the transistor 240 is coupled to the pad 210, and another terminal of the transistor 240 is coupled to the voltage terminal VSS.

In some embodiments, the transistor 220 is a first conductivity type (i.e., P-type) transistor, and the transistors 230 and 240 are second conductivity type (i.e., N-type) transistors.

In some embodiments, the breakdown voltage of the transistor 230 is greater than, for example, a trigger voltage of the transistor 240 as the ESD primary circuit of FIG. 2A. In alternative embodiments, an absolute value of the breakdown voltage of the transistor 230 is N times greater than an absolute value of the breakdown voltage of the transistor 220, in which N is greater than about 2. The details of the configuration of the transistors 220-240 will be discussed in the following paragraphs.

The integrated circuit 200 is given for illustrative purposes. Various implements of the integrated circuit 200 are within the contemplated scope of the present disclosure. For example, in some embodiments, the integrated circuit 200 includes multiple P-type transistors coupled in parallel to operate as the transistor 220, and/or multiple N-type transistors coupled in parallel to operate as the transistor 230 and/or the transistor 240.

Figure 2B:
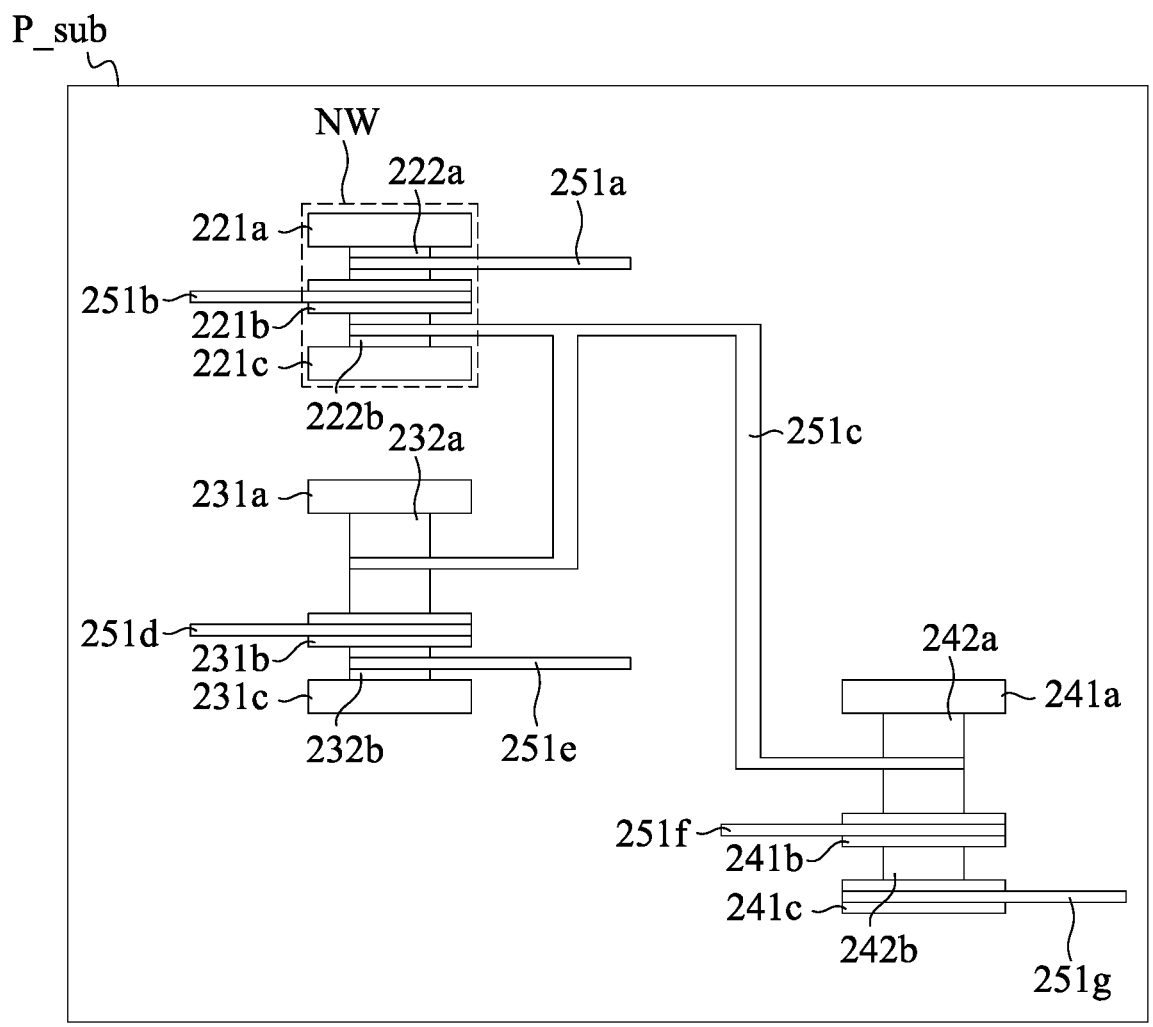
FIG. 2B is a layout diagram in a plan view of part of the integrated circuit in FIG. 2A, in accordance with some embodiments.

Reference is now made to FIG. 2B. FIG. 2B is a layout diagram in a plan view of part of the integrated circuit 200 in FIG. 2A, in accordance with some embodiments. For illustration, the integrated circuit 200 includes a substrate P_sub, a well region NW of the second conductivity type (i.e., N-type), gates 221a-221c, 231a-231c, 241a-241c, active regions 222a, 222b, 232a, 232b, 242a, 242b, and conductive segments 251a-251g. In some embodiments, the gates 221a-221c and the active regions 222a, 222b are disposed in the well region NW. The gates 231a-231c, 241a-241c and the active regions 232a, 232b, 242a, and 242b are disposed on the substrate P_sub. The conductive segments 251a-251g are arranged, for example, above the gates 221a-221c, 231a-231c, 241a-241c and the active regions 222a, 222b, 232a, 232b, 242a, 242b.

For illustration, the gates 221a-221c and the conductive segments 251a-251b, and 251c together correspond to the transistor 220. The gates 231a-231c and the conductive segments 251c, 251d, and 251e together correspond to the transistor 230. The gates 241a-241c and the conductive segments 251c, 251f, and 251g together correspond to the transistor 240. In such embodiments, the transistors 220-240 share the conductive segment 251c, which corresponds to the transistors 220-240 being coupled to the pad 210 through the conductive segment 251c as shown in FIG. 2A.

For further illustration of FIG. 2B, the conductive segment 251a corresponds to a source terminal of the transistor 220. The gate 221b and the conductive segment 251b together correspond to a gate terminal of the transistor 220. The conductive segment 251c corresponds to a drain terminal of the transistor 220. The conductive segment 251c also corresponds to a drain terminal of the transistor 230. The gate 231b and the conductive segment 251d together correspond to a gate terminal of the transistor 230. The conductive segment 251e corresponds to a source terminal of the transistor 230. The conductive segment 251c further corresponds to a drain terminal of the transistor 240. The gate 241b and the conductive segment 251f together correspond to a gate terminal of the transistor 240. The conductive segment 251g corresponds to a source terminal of the transistor 240.

In some embodiments, the gates 221a, 221c, 231a, 231c, 241a, and 241c are referred to as dummy gates, in which in some embodiments, the "dummy" gates are referred to as being not electrically connected as the gates for MOS devices, having no function in the circuit.

The active region 222a is coupled to the voltage terminal VDDIO through the conductive segment 251a. The active region 222b is coupled to the active regions 232a and 242a through the conductive segment 251c. The active region 232b is coupled to the voltage terminal VSS through the conductive segment 251e. The active region 242b is coupled to the voltage terminal VSS through the conductive segment 251g.

With continued reference to FIG. 2B, for illustration, a width of the active region 232a is greater than a width of the active region 232b, and also greater than width of the active regions 222a, 222b, and 242b. In some embodiments, the width of the active region 232a is substantially equal to a width of the active region 242a. In alternative embodiments, the width of the active region 232a is around 5 to around 6 times greater than the width of the active regions 232b, 222a, 222b, and 242b.

With the configurations of FIG. 2B, the active region 232a is configured for the formation of the transistor 230, while the conductive segment 251c corresponds to the drain terminals of the transistor 230 that coupled to the pad 210, in some embodiments. In such embodiments, the transistor 230, having a broader width of the active region 232a coupled to the pad 210 to receive the ESD current, gets an increased and greater drain-ballasting to boost ESD performance, compared with some approaches. Accordingly, when the ESD event occurs, the transistor 230 as the pull-down circuit 130 of FIG. 1 is capable to withstand the large ESD current.

In some approaches, the pull-down circuit associated with the transistor 230 in FIG. 2A includes a transistor having an active region coupled to a pad to receive the ESD current, in which a width of the active region is equal to width of other normal active regions coupled to supply voltages, for example, the voltage terminal VDDIO and/or VSS. Accordingly, the transistor discussed above has a typical breakdown voltage. Moreover, the pull-down circuit is coupled to an ESD primary circuit associated with the transistor 240 in FIG. 2A. However, in some approaches, a trigger voltage of the ESD primary circuit is greater than the breakdown voltage of the transistor included in the pull-down circuit. Therefore, when the voltage, induced by an ESD event, cross the pull-down circuit and the ESD primary circuit increases and reaches the breakdown voltage of the transistor included in the pull-down circuit without reaching the trigger voltage of the ESD primary circuit, the transistor included in the pull-down circuit is destroyed by the ESD current before the ESD primary circuit is turned on to discharge the ESD current.

Compared to the above approaches, with the configuration as discusses above in the embodiments of FIGS. 2A-2B, the breakdown voltage of the transistor 230 can be increased and, for example, about 2 to 3 times greater than that in the above approaches.

The integrated circuit 200 of FIGS. 2A-2B is given for illustrative purposes. Various implements of the integrated circuit 200 are within the contemplated scope of the present disclosure. For example, in some embodiments, the width of the active region 222b is equal to the width of the active region 232a while the width of the active region 222a is equal to the width of the active region 232b.

In some embodiments, the widths of the active regions, coupled to the pad, of transistors are selected to be such that breakdown voltages of the transistors are increased and greater than the trigger voltage of the ESD primary circuit. The optimized width of the active regions is tradeoff by ESD performance, leakage current and the layout area.

Figure 3A:
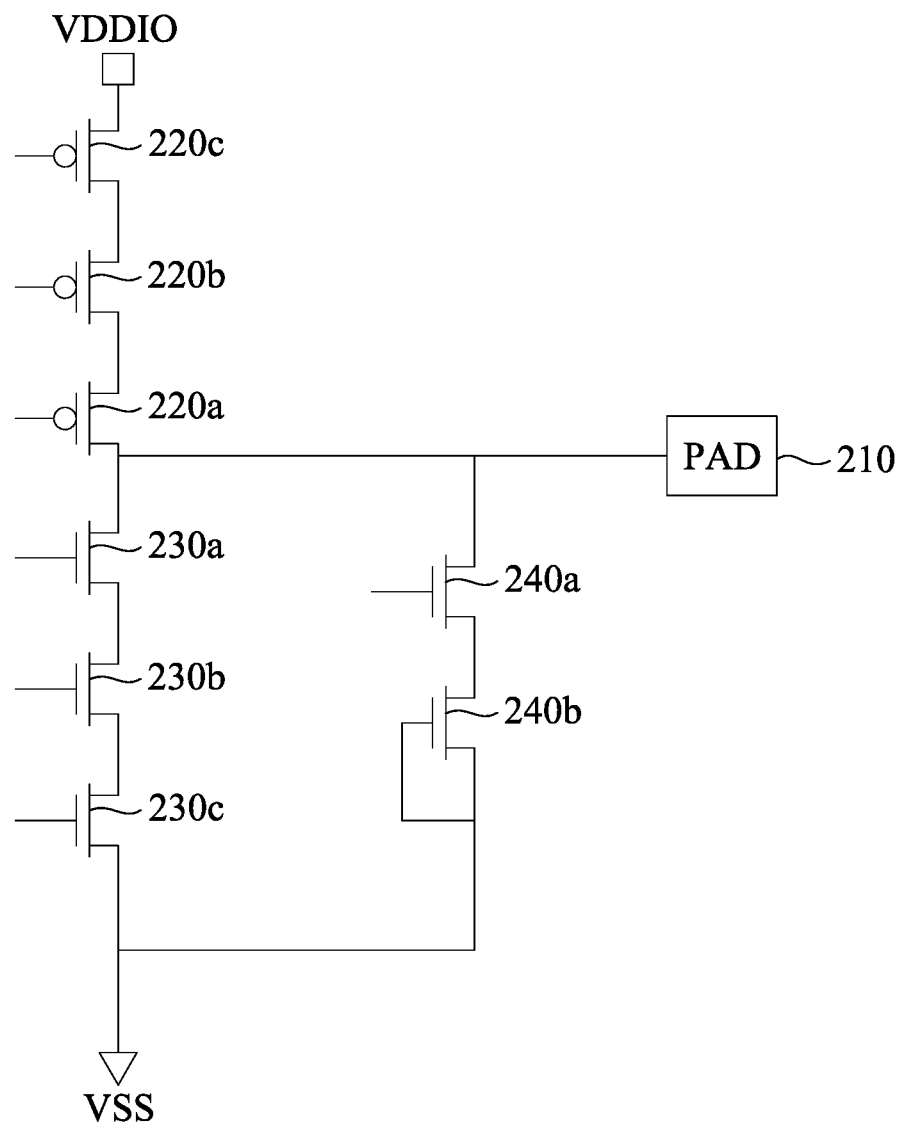
FIG. 3A is an equivalent circuit of part of an integrated circuit corresponding to the integrated circuit of FIG. 1, in accordance with various embodiment.

Reference is now made to FIG. 3A. FIG. 3A is an equivalent circuit of part of an integrated circuit 300 corresponding to the integrated circuit 100 of FIG. 1, in accordance with various embodiment. With respect to the embodiments of FIG. 3A, like elements in FIG. 2A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3A.

Compared with the integrated circuit 200 of FIG. 2A, the integrated circuit 300 further includes transistors 220a-220c, 230a-230c, and 240a-240b. The transistors 220a-220b are configured with respect to, for example, the transistor 220 of FIG. 2A, and configured to operate as the pull-up circuit 120 of FIG. 1. The transistor 230a is configured with respect to, for example, the transistor 230 of FIG. 2A, and the transistors 230a-230c are configured to operate as the pull-down circuit 130 of FIG. 1. The transistor 240a is configured with respect to, for example, the transistor 240 of FIG. 2A, and the transistors 240a-240b are configured to operate as the ESD primary circuit 140 of FIG. 1.

For illustration, the transistors 220a-220c are coupled in series between the voltage terminal VDDIO and the pad 210. The transistors 230b-230c are coupled in series to a terminal of the transistor 230a and the voltage terminal VSS while another terminal of the transistor 230a is coupled to the pad 210. The transistor 240b is coupled in series to a terminal of the transistor 240a and the voltage terminal VSS while another terminal of the transistor 240a is coupled to the pad 210. A control terminal of the transistor 240b is coupled to the voltage terminal VSS.

In some embodiments, the transistors 220a-220c are first conductivity type (i.e., P-type) transistor, and the transistors 230a-230c and 240a-240b are second conductivity type (i.e., N-type) transistors.

In some embodiments, a breakdown voltage of the transistors 230a-230c as a whole is greater than a trigger voltage of the transistors 240a-240b as a whole. Alternatively stated, the transistors 240a-240b are turned on before the transistors 230a-230c are destroyed.

In some embodiments, the breakdown voltage of the transistor 230a is N times greater than breakdown voltages of the transistors 230b-230c, in which N is greater than about 2. An absolute value of the breakdown voltage of the transistor 230a is N times greater than an absolute value of a breakdown voltage of each one of the transistor 220a-220c. In alternative embodiments, the breakdown voltage of the transistor 230a is substantially the same as the breakdown voltage of the transistor 240a. The details of the configuration of the transistors 220a-220c, 230a-230c, and 240a-240b will be discussed in the following paragraphs.

The integrated circuit 300 is given for illustrative purposes. Various implements of the integrated circuit 300 are within the contemplated scope of the present disclosure. For example, in some embodiments, the breakdown voltage of the transistor 230a is greater than the trigger voltage of the transistors 240a-240b as a whole.

Figure 3B:
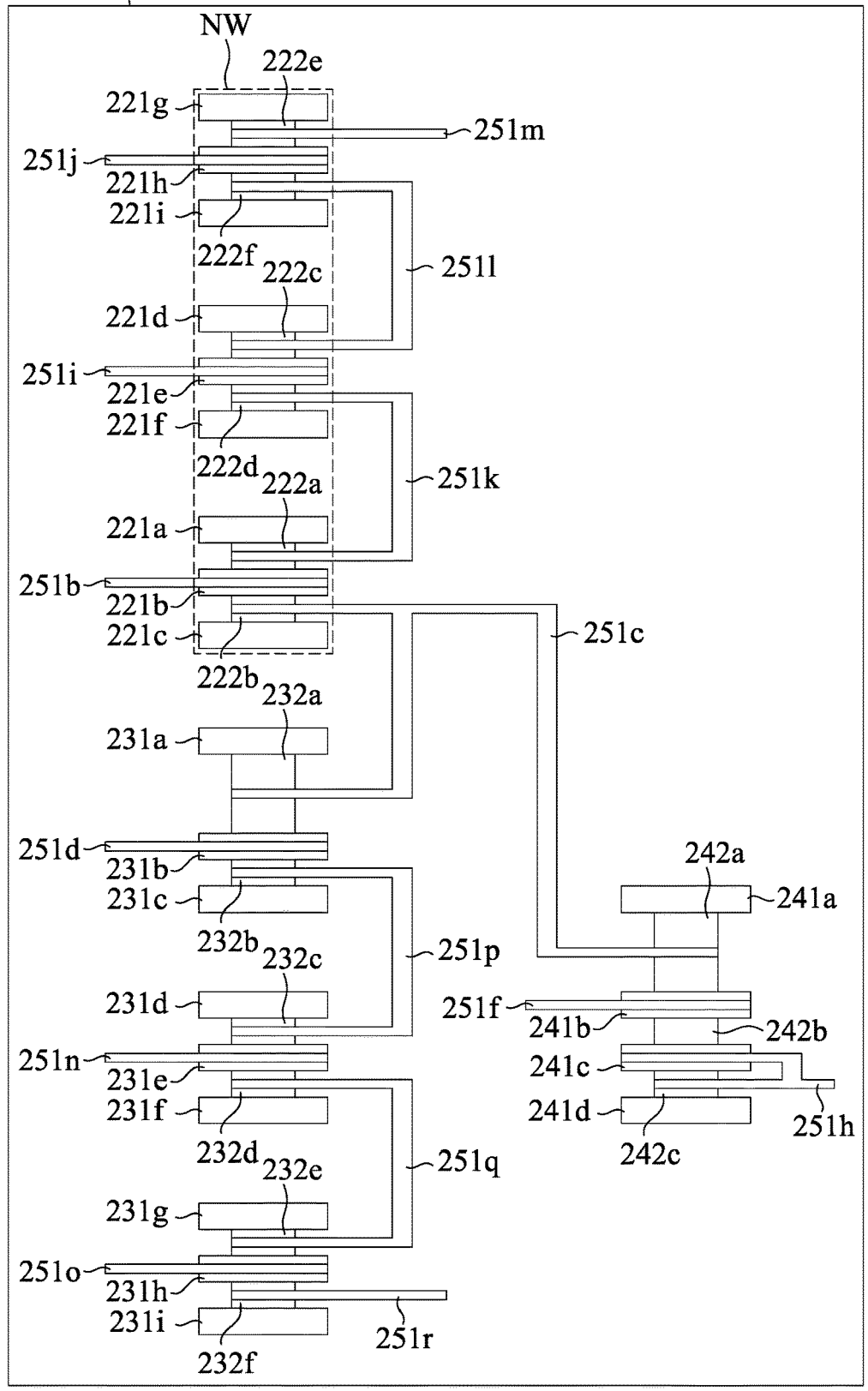
FIG. 3B is a layout diagram in a plan view of part of the integrated circuit in FIG. 3A, in accordance with some embodiments.

Reference is now made to FIG. 3B. FIG. 3B is a layout diagram in a plan view of part of the integrated circuit 300 in FIG. 3A, in accordance with some embodiments. With respect to the embodiments of FIG. 3B, like elements in FIG. 2B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3B.

Compared with the integrated circuit 200 of FIG. 2B, the integrated circuit 300 further includes gates 221d-221i, 231d-231i, and 241d, active regions 222c-222f, 232c-232f, and 242c, and conductive segments 251h-251r. In some embodiments, the gates 221d-221i and the active regions 222c-222f are disposed in the well region NW. The gates 231d-231i, 241d and the active regions 232c-232f, 242c are disposed on the substrate P_sub. The conductive segments 251h-251r are arranged, for example, above the gates 221d-221i, 231d-231i, and 241d and the active regions 222c-222f, 232c-232f, and 242c.

For illustration, the gates 221d-221f and the conductive segments 251i, 251l, 251k together correspond to the transistor 220b. The gates 221g-221i and the conductive segments 251j, 251l, 251m together correspond to the transistor 220c. The gates 231d-231f and the conductive segments 251n, 251p, 251q together correspond to the transistor 230b. The gates 231g-231i and the conductive segments 251o, 251q, 251r together correspond to the transistor 230c. The gates 241c-241d and the conductive segment 251f together correspond to the transistor 240b. In some embodiments, the gates 221d, 221f, 221g, 221i, 231a, 231c, 231d, 231f, 231g, 231i, and 241d are referred to as the dummy gates.

For further illustration of FIG. 3B, the conductive segment 251k corresponds to a source terminal of the transistor 220a and a drain terminal of the transistor 220b. The gate 221e and the conductive segment 251i together correspond to a gate terminal of the transistor 220b. The conductive segment 251l corresponds to a source terminal of the transistor 220b and a drain terminal of the transistor 220c. The gate 221h and the conductive segment 251j together correspond to a gate terminal of the transistor 220c. The conductive segment 251m corresponds to a source terminal of the transistor 220c. In such embodiments, the transistors 220a-220b share the conductive segment 251k, that corresponds to the transistors 220a-220b being coupled to each other through the conductive segment 251k. The transistors 220b-220c share the conductive segment 251l, that corresponds to the transistors 220b-220c being coupled to each other through the conductive segment 251l.

The conductive segment 251p corresponds to a drain terminal of the transistor 230a and a source terminal of the transistor 230b. The gate 231e and the conductive segment 251n together correspond to a gate terminal of the transistor 230b. The conductive segment 251q corresponds to a drain terminal of the transistor 230b and a source terminal of the transistor 230c. The gate 231h and the conductive segment 2510 together correspond to a gate terminal of the transistor 230c. The conductive segment 251r corresponds to a source terminal of the transistor 230c. In such embodiments, the transistors 230a-230b share the conductive segment 251p, that corresponds to the transistors 230a-230b being coupled to each other through the conductive segment 251p. The transistors 230b-230c share the conductive segment 251q, that corresponds to the transistors 230b-230c being coupled to each other through the conductive segment 251q.

The conductive segment 251h corresponds to the source of the transistor 240b, and the gate 241c and the conductive segment 251h together correspond to a gate terminal of the transistor 240b. In such embodiments, the transistors 240a-240b share the active region 242b, that corresponds to the transistors 240a-240b being coupled to each other.

The active region 222e is coupled to the voltage terminal VDDIO through the conductive segment 251m. The active region 232f is coupled to the voltage terminal VSS through the conductive segment 251r. The active region 242c is coupled to the voltage terminal VSS through the conductive segment 251h.

With continued reference to FIG. 3B, for illustration, the width of the active region 232a is greater than widths of the active regions 232b-232f, and also greater than widths of the active regions 222c-222e, and 242c. In some embodiments, the width of the active region 232a is around 5 to around 6 times greater than the width of the active regions 232b-232f, 222c-222e, and 242c.

With the configurations of FIGS. 3A-3B, the integrated circuit 300 having multiple transistors as the pull-down circuit and the ESD primary circuit operates in higher voltage domain, for example, the voltage VDDIO being about 3.3 Volts, compared with the integrated circuit 200 having single transistor as the pull-down circuit and the ESD primary circuit operates with the voltage VDDIO being about 1.8 Volts.

The configurations of FIGS. 3A-3B are given for illustrative purposes. Various implements of the integrated circuit 300 are within the contemplate scope of the present disclosure. For example, in some embodiments, the number of the transistors included in one operating as the pull-down circuit is less than 3.

Figure 3C:
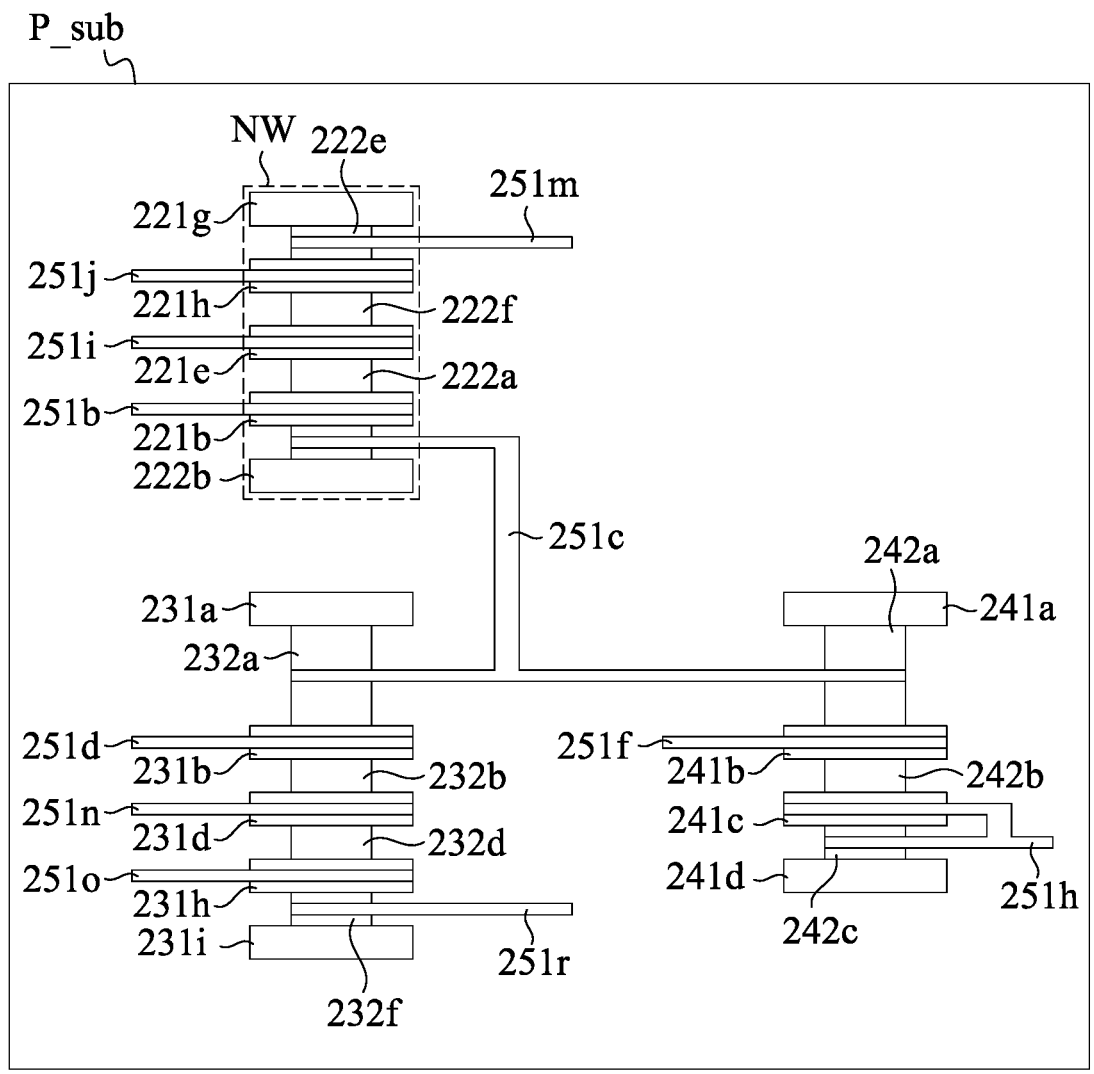
FIG. 3C is a layout diagram in a plan view of part of the integrated circuit in FIG. 3A, in accordance with another embodiments.

Reference is now made to FIG. 3C. FIG. 3C is a layout diagram in a plan view of part of the integrated circuit 300 in FIG. 3A, in accordance with another embodiments. With respect to the embodiments of FIG. 3C, like elements in FIG. 3B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3C.

Compared with the integrated circuit 300 of FIG. 3B, instead of having separate active regions, transistors, corresponding to the transistors 220a-220c, 230a-230c of FIG. 3A, of the integrated circuit 300' includes shared active regions. For illustration, the transistors 220a-220b share the active region 222a, that corresponds to the transistors 220a-220b being coupled to each other at the source region of the transistor 220a and the drain region of the transistor 220b. The transistors 220b-220c share the active region 222f, that corresponds to the transistors 220b-220c being coupled to each other at the source region of the transistor 220b and the drain region of the transistor 220c. Moreover, the transistors 230a-230b share the active region 232b, that corresponds to the transistors 230a-230b being coupled to each other at the source region of the transistor 230a and the drain region of the transistor 230b. The transistors 230b-230c share the active region 232d, that corresponds to the transistors 230b-230c being coupled to each other at the source region of the transistor 230b and the drain region of the transistor 230c.

With the configurations of FIG. 3C, the integrated circuit 300' with shared active regions occupies a smaller area in layout design, compared with the integrated circuit 300 of FIG. 3B.

Figure 4A:
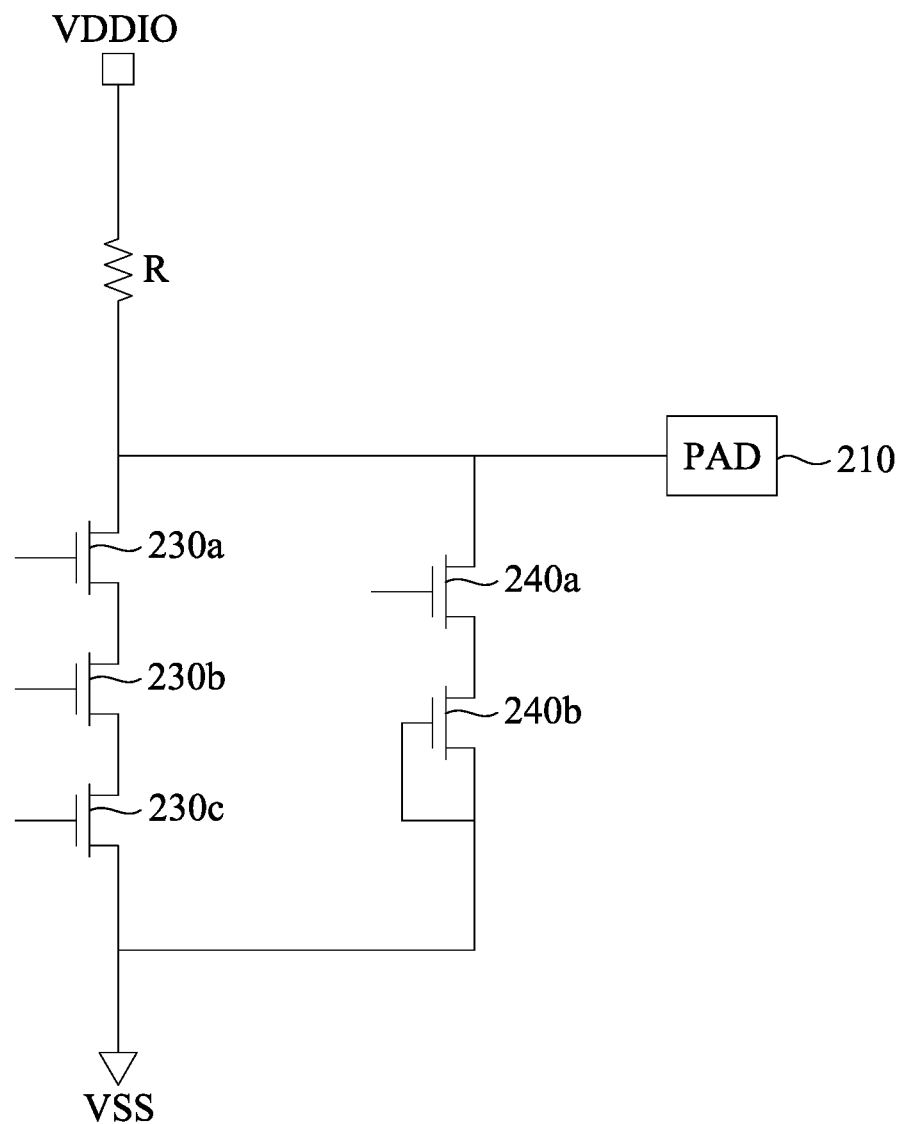
FIG. 4A is an equivalent circuit of part of an integrated circuit corresponding to the integrated circuit of FIG. 1, in accordance with some embodiments.

Reference is now made to FIG. 4A. FIG. 4A is an equivalent circuit of part of an integrated circuit 400 corresponding to the integrated circuit 100 of FIG. 1, in accordance with some embodiments. With respect to the embodiments of FIG. 4A, like elements in FIG. 3A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4A.

Compared with the integrated circuit 300 of FIG. 3A, instead of having the multiple transistors 220a-220c corresponding to the pull-up circuit 120 of FIG. 1, the integrated circuit 400 includes a resistive element R coupled between the voltage terminal VDDIO and the pad 210. In some embodiments, the resistive element R is implement with a resistor having high resistance to provide ESD protection.

Figure 4B:
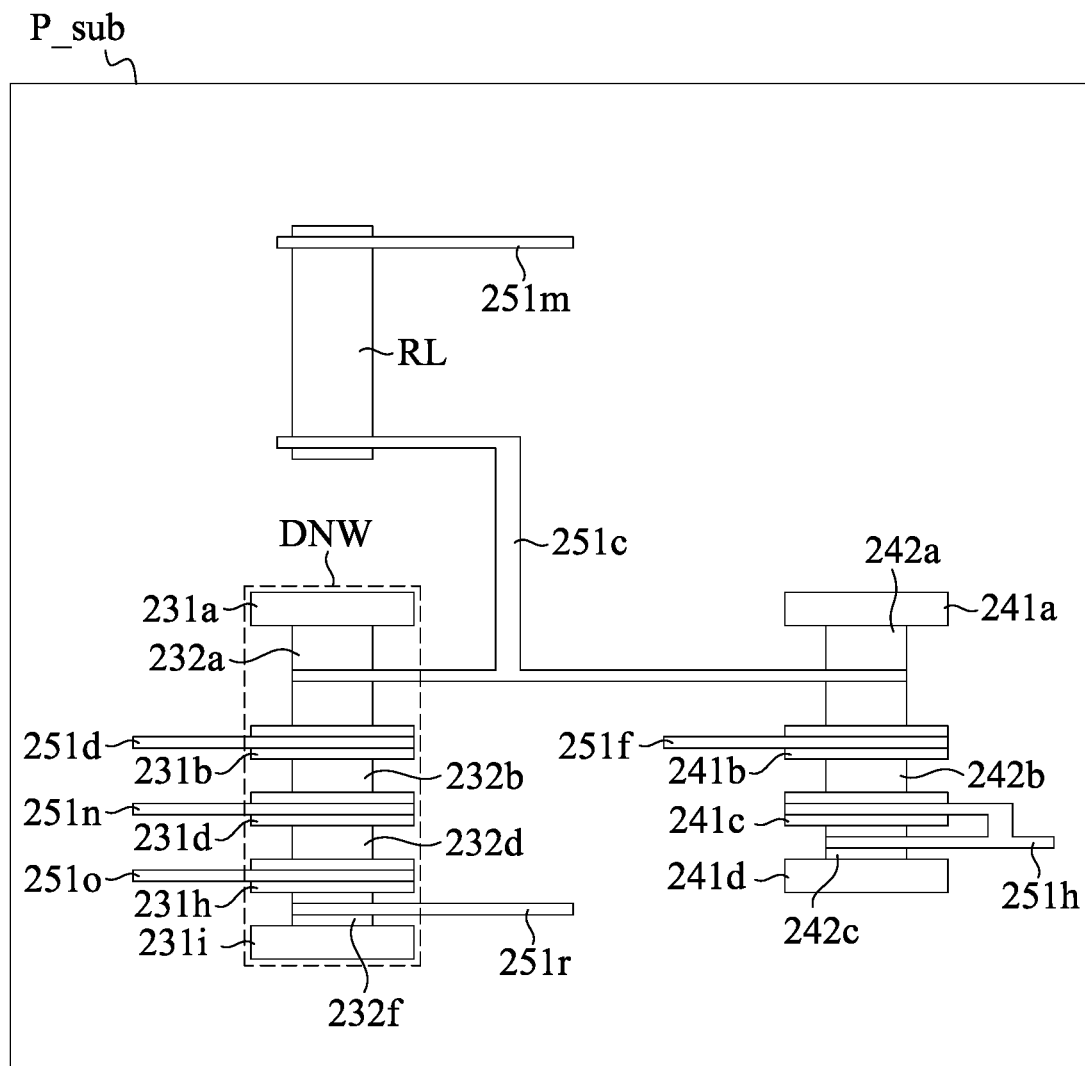
FIG. 4B is a layout diagram in a plan view of part of the integrated circuit in FIG. 4A, in accordance with some embodiments.

Reference is now made to FIG. 4B. FIG. 4B is a layout diagram in a plan view of part of the integrated circuit 400 in FIG. 4A, in accordance with some embodiments. With respect to the embodiments of FIG. 4B, like elements in FIG. 3B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4B.

Compared with the integrated circuit 300 of FIG. 3B, instead of having structures corresponding to the transistors 220a-220c of FIG. 3A, the integrated circuit 400 includes a resistive structure RL corresponding to the pull-up circuit 120 of FIG. 1, and a well region DNW disposed on the substrate P_sub. For illustration, the resistive structure is disposed on the substrate P_sub, and is coupled to the voltage terminal VDDIO through the conductive segment 251*m* and the active region 232*a* and 242*a* through the conductive segment 251*c*. Moreover, instead of being disposed on the substrate P_sub, the gates 231*a*, 231*b*, 231*d*, 231*h*, and 231*i*, the active regions 232*a*-232*b*, 232*d*, and 232*f* are disposed in a well region DNW.

The configurations of the integrated circuit 400 of FIGS. 4A-4B are given for illustrative purposes. Various implements of the integrated circuit 400 are within the contemplate scope of the present disclosure. For example, in some embodiments, the transistors 230*a*-230*c* include separate active regions, instead of having shared active regions as shown in FIG. 4B.

Figure 5A:
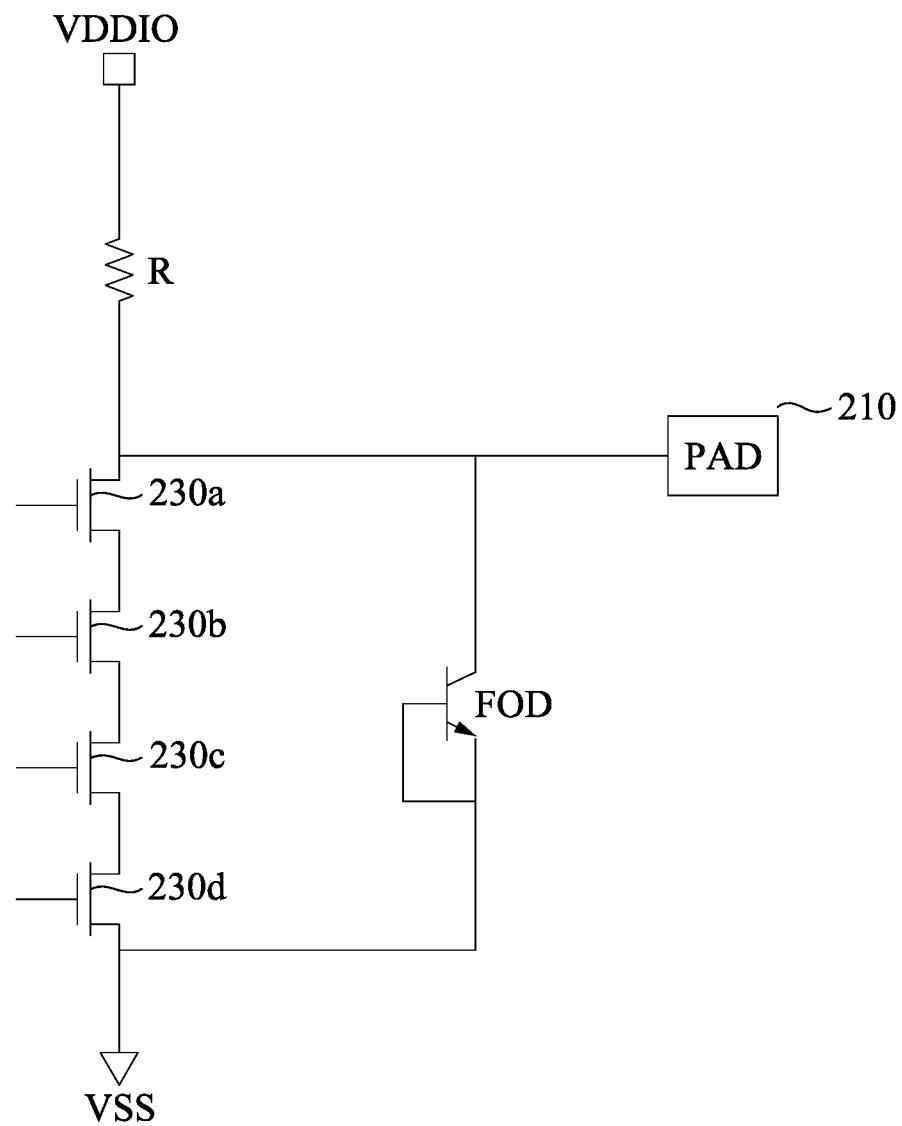
FIG. 5A is an equivalent circuit of part of an integrated circuit corresponding to the integrated circuit of FIG. 1, in accordance with some embodiments.

Reference is now made to FIG. 5A. FIG. 5A is an equivalent circuit of part of an integrated circuit 500 corresponding to the integrated circuit 100 of FIG. 1, in accordance with some embodiments. With respect to the embodiments of FIG. 5A, like elements in FIG. 4A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5A.

Compared with the integrated circuit 400 of FIG. 4A, the integrated circuit 500 includes a transistor FOD corresponding to the ESD primary circuit 140 of FIG. 1, and a transistor 230*d* of the second conductivity type (i.e., N-type). For illustration, a terminal of the transistor FOD is coupled to the resistive element R, and the pad 210, and another terminal of the transistor FOD is coupled to the voltage terminal VSS and a terminal of the transistor 230*d*. A control terminal of the transistor FOD is coupled to the another terminal of the transistor FOD and the voltage terminal VSS. The transistor 230*d* is coupled in series to the transistor 230*c* and the voltage terminal VSS. In some embodiments, the transistors 230*a*-230*d* operate together as one corresponding to the pull-down circuit 130 of FIG. 1.

In some embodiments, the transistor FOD is implemented by a field oxide device to shunt ESD charges at the pad 210. The transistor FOD is given for illustrative purposes. Various implements of the transistor FOD is within the contemplate scope of the present disclosure. For example, in some embodiments, the transistor FOD is a thick field oxide device with a tunable threshold voltage.

Figure 5B:
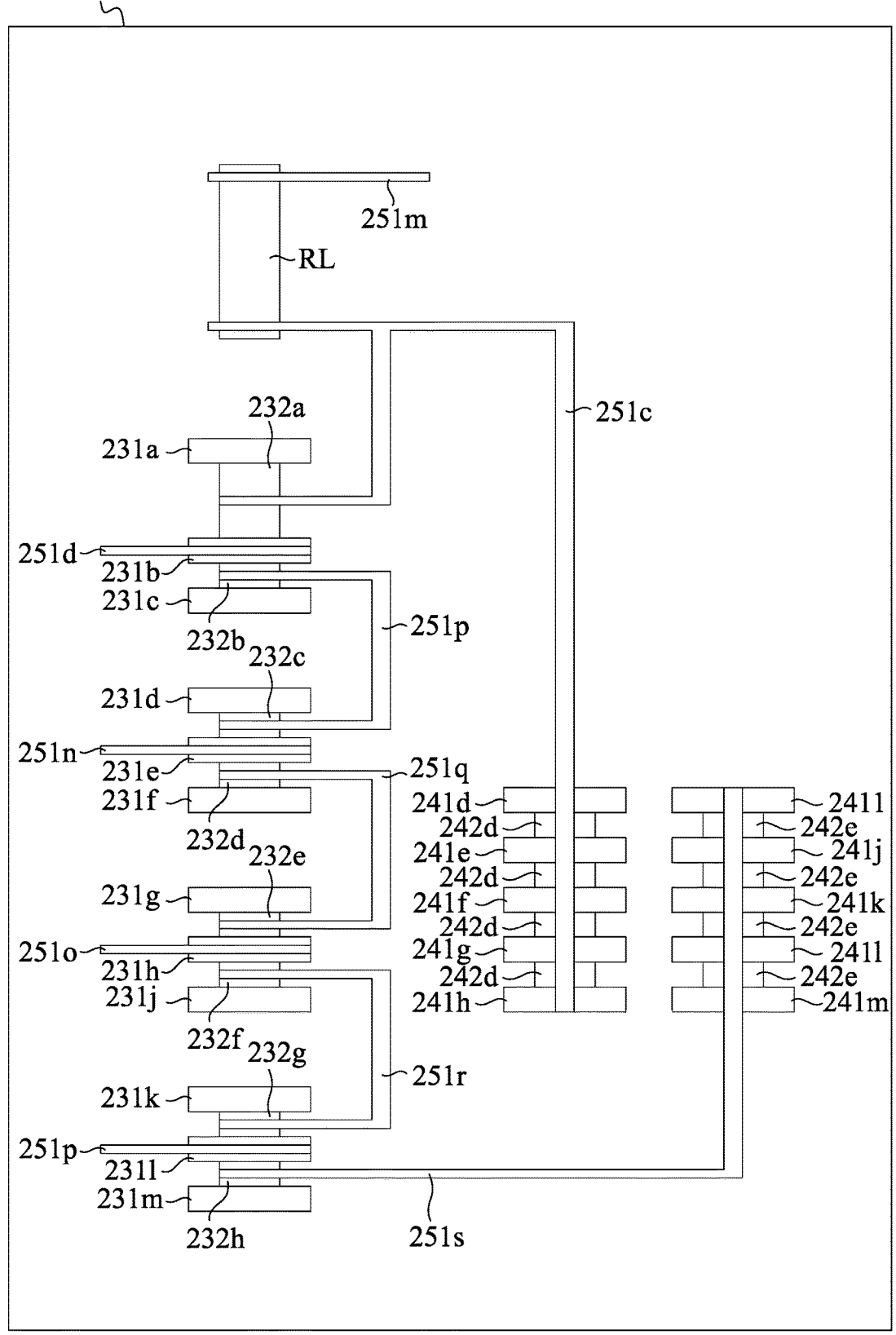
FIG. 5B is a layout diagram in a plan view of part of the integrated circuit in FIG. 5A, in accordance with some embodiments.

Reference is now made to FIG. 5B. FIG. 5B is a layout diagram in a plan view of part of the integrated circuit 500 in FIG. 5A, in accordance with some embodiments. With respect to the embodiments of FIG. 5B, like elements in FIGS. 3B and 4B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5B.

Compared with the integrated circuit 400 of FIG. 4B, the integrated circuit 500 includes separate active regions as discussed in FIG. 3B, gates 231*j*-231*l*, 241*d*-241*m*, and active regions 232*g*-232*h*, and 242*d*-242*e*, and a conductive segment 251*s*. For illustration, the gates 231*j*-231*l* and the active regions 232*g*-232*h* are disposed in the well region DNW. The gates 241*d*-241*h* and the active region 242*d* are disposed in the well region NW on the substrate P_sub. The gates 241*i*-241*m* and the active region 242*e* are disposed on the substrate P_sub. In some embodiments, the conductive segment 251*c* is further arranged above the gates 241*d*-241*h* and the active region 242*d*. The conductive segment 251*r* is further arranged above the active region 232*g*. The conductive segment 251*s* is arranged above the active regions 232*h* and 242*e* and the gates 241*i*-241*m*.

For illustration, the gates 231*j*-232*h* and the conductive segments 251*r*, 251*p*, and 251*s* together correspond to the transistor 230*d*. Specifically, the gate 231*l* and the conductive segment 251*p* correspond to a gate terminal of the transistor 230*d*. The conductive segment 251*r* corresponds to a drain terminal of the transistor 230*d*. The conductive segment 251*s* corresponds to a source terminal of the transistor 230*d* and is coupled to the voltage terminal VSS. The gates 241*d*-241*m*, the conductive segments 251*c* and 251*r*, and the substrate P_sub together correspond to the transistor FOD. Specifically, the conductive segment 251*c* corresponds to a first terminal, coupled to the pad 210, of the transistor FOD. The conductive segment 251*s* corresponds to a second terminal, coupled to the voltage terminal VSS and the source terminal of the transistor 230*d*, of the transistor FOD. The substrate P_sub corresponds to a third terminal, coupled to the second terminal of the transistor FOD and the voltage terminal VSS, of the transistor FOD. In some embodiments, the gates 241*d*-241*m* are referred to as the dummy gates.

The active region 232*h* is coupled to the active region 242*e* through the conductive segment 251*s*. The active region 242*d* is coupled to the resistive structure RL, the active region 232*a*, and the pad 210 through the conductive segment 251*c*.

In some embodiments, the active region 242*d* is the first conductivity type (i.e., the P-type) and the active region 242*e* is the second conductivity type (i.e., the N-type). The configurations of the transistor FOD are given for illustrative purposes. Various implements of the transistor FOD are within the contemplate scope of the present disclosure. For example, in some embodiments, the active regions includes in the transistor FOD have the same conductivity type (i.e., the N-type).

With continued reference to FIG. 5B, for illustration, the width of the active region 232*a* is greater than widths of the active regions 232*g*-232*h*. In some embodiments, the width of the active region 232*a* is around 5 to around 6 times greater than the width of the active regions 232*g*-232*h*.

In some approaches, an integrated circuit includes a transistor corresponding to the transistor 230*a*, but the transistor has active regions with equal widths. As the result, the integrated circuit passes the human body model test at about 1.5 KV and fails at about 1.8 KV, and passes the charge device model test at 450V and fails at 500V. Compared to the above approaches, with the configurations of FIGS. 5A-5B, the integrated circuit 500 provides good ESD protection to internal circuits operating in higher voltage domain. For example, in some embodiments of the present disclosure, the integrated circuit 500 passes the human body model test at about 2.5 KV and the charge device model test at about 700 V (i.e., peak of the current is about 6.7 A). Furthermore, by comparing results of the transmission line pulse (TLP) test, the breakdown current increases from about 1.1 A, as shown in some approaches, to about 3.2 A, as shown in some embodiments of the present disclosure. Alternatively stated, the integrated circuit 500 obtains great improvement in the transmission line pulse test, compared with some approaches.

The configurations of FIGS. 5A-5B are given for illustrative purposes. Various implements of the integrated circuit 300 are within the contemplate scope of the present disclosure. For example, in some embodiments, the number of the transistors included in one operating as the pull-down circuit is more than 4.

Reference is now made to FIG. 6. FIG. 6 is a flow chart of a method 600 of operating the integrated circuit 100, 200, 300, 400, or 500, in accordance with some embodiments. It is understood that additional operations can be provided before, during, and after the processes shown by FIG. 6, and some of the operations described below can be replaced or eliminated, for additional embodiments of the method. The order of the operations/processes may be interchangeable. Throughout the various views and illustrative embodiments, like reference numbers are used to designate like elements. The method 600 includes operations 610-620 that are described below with reference to FIG. 2A.

In operation 610, electrostatic charges are discharged from the pad 210 to the voltage terminal VSS through the active region 232a and the active region 232b. In some embodiments, the active region 232a and the active region 232b have N-type conductivity, and the width of the active region 232a and the active region 232b are different from each other. The active region 232a and the active region 232b are included in the transistor 230, of N-type doped, having a first breakdown voltage.

In some embodiments, the width of the active region 232a is around 5 to around 6 times greater than the width of the active region 232b.

In some embodiments, with reference to FIG. 3B, the electrostatic charges are discharged from the pad 210 to the voltage terminal VSS through the active regions 232c-232f that are coupled between the active region 232b and the voltage terminal VSS. The active regions 232a-232f have the same conductivity type. The width of the active region 232a greater than the widths of the active regions 232b-232f.

In some embodiments, the active regions 232c-232f are included in structures operating as the transistors 230b-230c, in which each of the transistors 230b-230c has a second breakdown voltage smaller than the first breakdown voltage.

In some embodiments, with reference to FIG. 3B, electrostatic charges are discharged from the pad 210 to the voltage terminal VDDIO through the active regions 222a-222f coupled between the pad 210 and the voltage terminal VDDIO. The active regions 222a-222f have P-type conductivity. In some embodiments, the width of the active region 232a is greater than the widths of the active regions 222a-222f.

In operation 620, the electrostatic charges are discharged through the ESD primary circuit, including, for example, the ESD primary circuit 140 of FIG. 1 and the transistor 240 of FIG. 2A. In some embodiments, the transistor 240 has a terminal coupled with the active region 232a as shown and the voltage terminal VSS. In some embodiments, the ESD primary circuit 140 has a trigger voltage lower than the first breakdown voltage, for example, the breakdown voltage of the transistor 230 of FIG. 2A.

In some embodiments, in operation 620, with reference to FIG. 2B, the electrostatic charges are discharged through the active region 242a coupled to the pad 210 and the active region 242b coupled between the active region 242a and the voltage terminal VSS.

In some embodiments, the active regions 232a and 242a have a first width, and the active regions 232b and 242b have a second width smaller than the first width.

Figure 7:
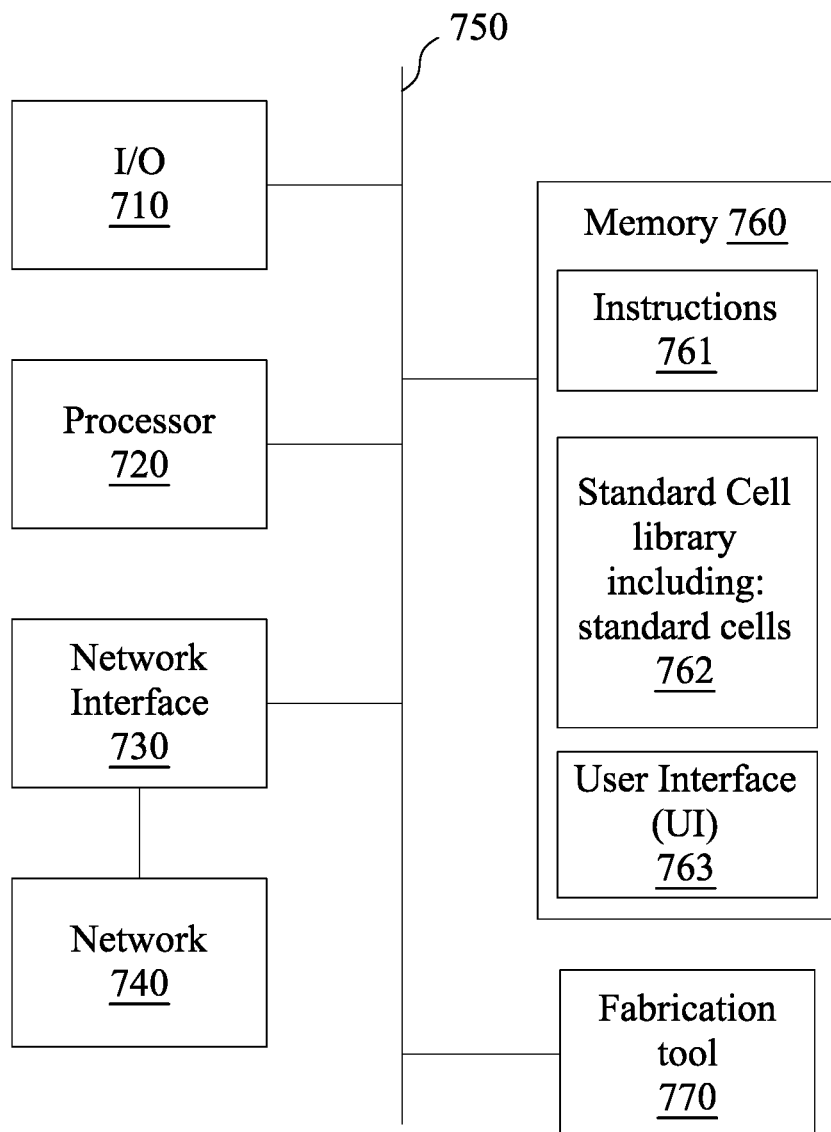
FIG. 7 is a block diagram of a system for designing the integrated circuit layout design, in accordance with some embodiments of the present disclosure.

Reference is now made to FIG. 7. FIG. 7 is a block diagram of an electronic design automation (EDA) system 700 for designing the integrated circuit layout design, in accordance with some embodiments of the present disclosure. EDA system 700 is configured to implement one or more operations of the method 600 disclosed in FIG. 6, and further explained in conjunction with FIGS. 2A-5B. In some embodiments, EDA system 700 includes an APR system.

In some embodiments, EDA system 700 is a general purpose computing device including a hardware processor 720 and a non-transitory, computer-readable storage medium 760. Storage medium 760, amongst other things, is encoded with, i.e., stores, computer program code (instructions) 761, i.e., a set of executable instructions. Execution of instructions 761 by hardware processor 720 represents (at least in part) an EDA tool which implements a portion or all of, e.g., the method 600.

The processor 720 is electrically coupled to computer-readable storage medium 760 via a bus 750. The processor 720 is also electrically coupled to an I/O interface 710 and a fabrication tool 770 by bus 750. A network interface 730 is also electrically connected to processor 720 via bus 750. Network interface 730 is connected to a network 740, so that processor 720 and computer-readable storage medium 760 are capable of connecting to external elements via network 740. The processor 720 is configured to execute computer program code 761 encoded in computer-readable storage medium 760 in order to cause EDA system 700 to be usable for performing a portion or all of the noted processes and/or methods. In one or more embodiments, processor 720 is a central processing unit (CPU), a multi-processor, a distributed processing system, an application specific integrated circuit (ASIC), and/or a suitable processing unit.

In one or more embodiments, computer-readable storage medium 760 is an electronic, magnetic, optical, electromagnetic, infrared, and/or a semiconductor system (or apparatus or device). For example, computer-readable storage medium 760 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 760 includes a compact disk-read only memory (CD-ROM), a compact disk-read/write (CD-R/W), and/or a digital video disc (DVD).

In one or more embodiments, storage medium 760 stores computer program code 761 configured to cause EDA system 700 (where such execution represents (at least in part) the EDA tool) to be usable for performing a portion or all of the noted processes and/or methods. In one or more embodiments, storage medium 760 also stores information which facilitates performing a portion or all of the noted processes and/or methods. In one or more embodiments, storage medium 760 stores library 762 of standard cells including such standard cells as disclosed herein, for example, a cell including transistors 220-240 discussed above with respect to FIG. 2A.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 720.

EDA system 700 also includes network interface 730 coupled to processor 720. Network interface 730 allows EDA system 700 to communicate with network 740, to which one or more other computer systems are connected.

Network interface 730 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

EDA system 700 also includes the fabrication tool 770 coupled to processor 720. The fabrication tool 770 is configured to fabricate integrated circuits, e.g., the integrated circuit 100 illustrated in FIG. 1, according to the design files processed by the processor 720.

EDA system 700 is configured to receive information through I/O interface 710. The information received through I/O interface 710 includes one or more of instructions, data, design rules, libraries of standard cells, and/or other parameters for processing by processor 720. The information is transferred to processor 720 via bus 750. EDA system 700 is configured to receive information related to a UI through I/O interface 710. The information is stored in computer-readable medium 760 as user interface (UI) 763.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 8:
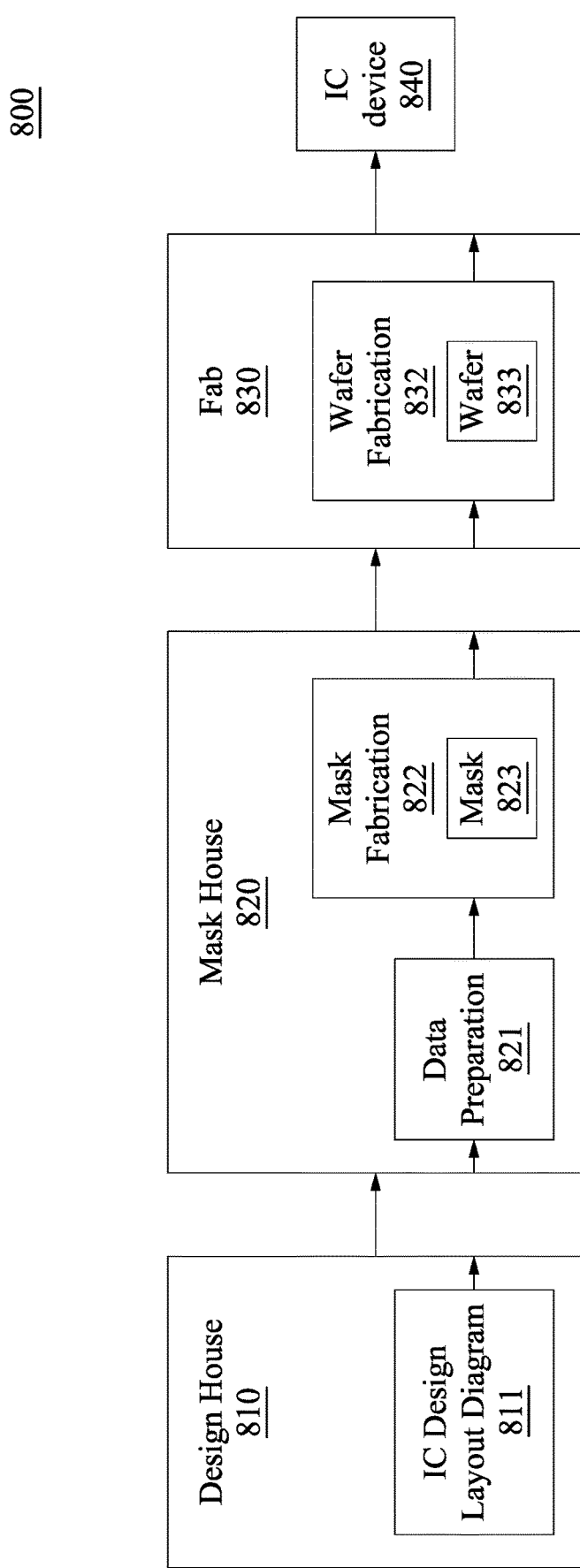
FIG. 8 is a block diagram of an integrated circuit manufacturing system, and an integrated circuit manufacturing flow associated therewith, in accordance with some embodiments.

FIG. 8 is a block diagram of IC manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 800.

In FIG. 8, IC manufacturing system 800 includes entities, such as a design house 810, a mask house 820, and an IC manufacturer/fabricator ("fab") 830, that interact with one another in the design, development, and manufacturing cycles and/or services related to manufacturing an IC device 840. The entities in IC manufacturing system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 810, mask house 820, and IC fab 830 is owned by a single larger company. In some embodiments, two or more of design house 810, mask house 820, and IC fab 830 coexist in a common facility and use common resources.

Design house (or design team) 810 generates an IC design layout diagram 811. IC design layout diagram 811 includes various geometrical patterns, for example, an IC layout design depicted in FIG. 2B, FIG. 3B, FIG. 4B, and FIG. 5B, designed for an IC device 840, for example, integrated circuits 200, 300, 400, and 500, discussed above with respect to FIG. 2B, FIG. 3B, FIG. 4B, and FIG. 5B. The geometrical patterns correspond to patterns of metal, oxide, or semiconductor layers that make up the various components of IC device 840 to be fabricated. The various layers combine to form various IC features. For example, a portion of IC design layout diagram 811 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 810 implements a proper design procedure to form IC design layout diagram 811. The design procedure includes one or more of logic design, physical design or place and route. IC design layout diagram 811 is presented in one or more data files having information of the geometrical patterns. For example, IC design layout diagram 811 can be expressed in a GDSII file format or DFII file format.

Mask house 820 includes data preparation 821 and mask fabrication 822. Mask house 820 uses IC design layout diagram 811 to manufacture one or more masks 823 to be used for fabricating the various layers of IC device 840 according to IC design layout diagram 811. Mask house 820 performs mask data preparation 821, where IC design layout diagram 811 is translated into a representative data file ("RDF"). Mask data preparation 821 provides the RDF to mask fabrication 822. Mask fabrication 822 includes a mask writer. A mask writer converts the RDF to an image on a substrate, such as a mask (reticle) 823 or a semiconductor wafer 833. The IC design layout diagram 811 is manipulated by mask data preparation 821 to comply with particular characteristics of the mask writer and/or requirements of IC fab 830. In FIG. 8, data preparation 821 and mask fabrication 822 are illustrated as separate elements. In some embodiments, data preparation 821 and mask fabrication 822 can be collectively referred to as mask data preparation.

In some embodiments, data preparation 821 includes optical proximity correction (OPC) which uses lithography enhancement techniques to compensate for image errors, such as those that can arise from diffraction, interference, other process effects and the like. OPC adjusts IC design layout diagram 811. In some embodiments, data preparation 821 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 821 includes a mask rule checker (MRC) that checks the IC design layout diagram 811 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 811 to compensate for limitations during mask fabrication 822, which may undo part of the modifications performed by OPC in order to meet mask creation rules.

In some embodiments, data preparation 821 includes lithography process checking (LPC) that simulates processing that will be implemented by IC fab 830 to fabricate IC device 840. LPC simulates this processing based on IC design layout diagram 811 to create a simulated manufactured device, such as IC device 840. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 811.

It should be understood that the above description of data preparation 821 has been simplified for the purposes of clarity. In some embodiments, data preparation 821 includes additional features such as a logic operation (LOP) to modify the IC design layout diagram 811 according to manufacturing rules. Additionally, the processes applied to IC design layout diagram 811 during data preparation 821 may be executed in a variety of different orders.

After data preparation 821 and during mask fabrication 822, a mask 823 or a group of masks 823 are fabricated based on the modified IC design layout diagram 811. In some embodiments, mask fabrication 822 includes performing one or more lithographic exposures based on IC design layout diagram 811. In some embodiments, an electron-beam (e-beam) or a mechanism of multiple e-beams is used to form a pattern on a mask (photomask or reticle) 823 based on the modified IC design layout diagram 811. Mask 823 can be formed in various technologies. In some embodiments, mask 823 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 823 includes a transparent substrate (for example, fused quartz) and an opaque material (for example, chromium) coated in the opaque regions of the binary mask. In another example, mask 823 is formed using a phase shift technology. In a phase shift mask (PSM) version of mask 823, various features in the pattern formed on the phase shift mask are configured to have proper phase difference to enhance the resolution and imaging quality. In various examples, the phase shift mask can be attenuated PSM or alternating PSM. The mask(s) generated by mask fabrication 822 is used in a variety of processes. For example, such a mask(s) is used in an ion implantation process to form various doped regions in semiconductor wafer 833, in an etching process to form various etching regions in semiconductor wafer 833, and/or in other suitable processes.

IC fab 830 includes wafer fabrication 832. IC fab 830 is an IC fabrication business that includes one or more manufacturing facilities for the fabrication of a variety of different IC products. In some embodiments, IC Fab 830 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 830 uses mask(s) 823 fabricated by mask house 820 to fabricate IC device 840. Thus, IC fab 830 at least indirectly uses IC design layout diagram 811 to fabricate IC device 840. In some embodiments, semiconductor wafer 833 is fabricated by IC fab 830 using mask(s) 823 to form IC device 840. In some embodiments, the IC fabrication includes performing one or more lithographic exposures based at least indirectly on IC design layout diagram 811. Semiconductor wafer 833 includes a silicon substrate or other proper substrate having material layers formed thereon. Semiconductor wafer 833 further includes one or more of various doped regions, dielectric features, multi-level interconnects, and the like (formed at subsequent manufacturing steps).

As described above, the integrated circuit of the present disclosure provides an ESD protection circuit implementing a drain-ballasted transistor coupled to a pad. During an ESD strike at the pad, the drain-ballasted transistor is capable to withstand and discharge a ESD current until an ESD primary circuit is turned on to discharge the ESD current. In some embodiments, a method is provided and includes the operation below: discharging electrostatic charges from a pad to a first voltage terminal through a first active region coupled to the pad and a second active region coupled between the first active region and the first voltage terminal, in which the first active region and the second active region are the same conductivity type and have different widths from each other, and the first active region and the second active region are included in a first transistor having a first breakdown voltage; and discharging the electrostatic charges through an ESD primary circuit having a first terminal coupled with the first active region and a second terminal coupled with the first voltage terminal. The ESD primary circuit has a trigger voltage lower than the first breakdown voltage. In some embodiments, a width of the first active region is around 5 to around 6 times greater than a width of the second active region. In some embodiments, the method further includes discharging the electrostatic charges from the pad to the first terminal through multiple third active regions that are coupled between the second active region and the first voltage terminal. The first active region, the second active region, and the third active regions have a first conductivity type. The plurality of third active regions are included in structures operating as multiple second transistors each having a second breakdown voltage smaller than the first breakdown voltage. In some embodiments, a width of the first active region is greater than width of the second active region, and the third active regions. In some embodiments, the method further includes discharging electrostatic charges from the pad to a second voltage terminal different through multiple fourth active regions that are coupled between the pad and the second voltage terminal. The plurality of fourth active regions have a second conductivity type different from the first conductivity type. A width of the first active region is greater than widths of the fourth active regions. In some embodiments, discharging the electrostatic charges through the ESD primary circuit includes discharging the electrostatic charges through a third active region coupled to the pad and the first active region and a fourth active region coupled between the third active region and the first voltage terminal. The first active region and the third active region has a first width, and the second active region and the fourth active region has a second width smaller than the first width.

Also disclosed is an integrated circuit that includes multiple first active regions of a first conductivity type that are coupled between a pad and a first voltage terminal and configured to discharge electrostatic charges to the first voltage terminal; and multiple second active regions of the first conductivity type that are coupled between the pad and the first voltage terminal and configured to discharge the electrostatic charges. First regions, arranged closer to the pad, in the first active regions and in the second active regions, are coupled with each other and have widths greater than widths of remaining active regions in the first active regions and in the second active regions. In some embodiments, the first active regions are included in a first transistor having a breakdown voltage, and the second active regions are included in an electrostatic discharge (ESD) primary circuit having a trigger voltage different from the breakdown voltage. In some embodiments, the breakdown voltage is greater than the trigger voltage. In some embodiments, the integrated circuit further includes multiple third active regions that are coupled between the pad and a second voltage terminal, wherein a first region, arranged closer to the pad, in the third active regions has a width smaller than the widths of the first regions in the first active regions and in the second active regions. The first voltage terminal provides a first supply voltage smaller than a second supply voltage provided by the second voltage terminal. In some embodiments, a second region of the third active regions is configured to receive the second supply voltage in an ESD event when the electrostatic charges are discharged to the first voltage terminal by the first active regions and the second active regions. In some embodiments, the integrated circuit further includes multiple third active regions, of a second conductivity type different from the first conductivity type, that are coupled between the pad and a second voltage terminal and arranged in a well of the first conductivity type, wherein a first region in the third active region, coupled to the first regions in the first active regions and in the second active regions, has a width smaller than the widths of the first regions in the first active regions and in the second active regions. The plurality of first active regions and the second active regions are disposed on a substrate. In some embodiments, the first active regions are disposed in a well of the first conductivity type in a substrate, and the second active regions are disposed on the substrate. In some embodiments, the first region and a second region, that are in the first active regions, are included in a first transistor, and third to fourth regions in the first active regions are included in a second transistor coupled in series with the first transistor. The second to third regions in the first active regions are coupled with each other and separated from each other by a portion of a substrate in a layout view.

Also disclosed is an integrated circuit includes a resistive device coupled between a pad and a first voltage terminal providing a first supply voltage, and configured to operate with the first supply voltage during an electrostatic discharge (ESD) event; and a first transistor and a second transistor that are coupled in parallel between the pad and a second voltage terminal different from the first voltage terminal. The first transistor is configured to clamp a voltage across the pad and the second voltage terminal in the ESD event when the second transistor is turned off, and the first transistor is further configured to discharge an ESD current to the second voltage terminal. The second transistor is configured to be turned on when the voltage reaches a trigger voltage of the second transistor and to discharge the ESD current to the second voltage terminal. In some embodiments, the first transistor includes first and second active regions and the second transistor includes third and fourth active regions. The first and third active regions are coupled together to the pad and have a first width, and the second and fourth active regions are coupled to the second voltage terminal and have a second width different from the first width. In some embodiments, the first width is greater than the second width. In some embodiments, the integrated circuit further includes multiple third transistors coupled between first transistor and the second voltage terminal. The first transistor has a first breakdown voltage, and each of the third transistors has a second breakdown voltage smaller than the first breakdown voltage. In some embodiments, the first and second transistors and the third transistors are of N type. In some embodiments, the resistive device includes a first active region of a first conductivity type, the first transistor includes a second active region of a second conductivity type different from the first conductivity type, and the second transistor includes a third active region of the second conductivity type. The first to third active regions are coupled together to the pad. A width of the first active region is smaller than a width of the second active region or the width of the third active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a plurality of first active regions of a first conductivity type that are coupled between a pad and a first voltage terminal and configured to discharge electrostatic charges to the first voltage terminal; and
a plurality of second active regions of the first conductivity type that are coupled between the pad and the first voltage terminal and configured to discharge the electrostatic charges,
wherein first regions, which are the closest active regions to the pad in the plurality of first active regions and in the plurality of second active regions, are coupled with each other and have widths greater than widths of remaining active regions in the plurality of first active regions and in the plurality of second active regions,
wherein the plurality of first active regions are included in a first transistor having a breakdown voltage, and
the plurality of second active regions are included in an electrostatic discharge (ESD) primary circuit having a trigger voltage different from the breakdown voltage.

2. The integrated circuit of claim 1, wherein the breakdown voltage is greater than the trigger voltage.

3. The integrated circuit of claim 1, further comprising:
a plurality of third active regions that are coupled between the pad and a second voltage terminal, wherein a first region, which is the closest active region to the pad in the plurality of third active regions, has a width smaller than the widths of the first regions in the plurality of first active regions and in the plurality of second active regions, wherein the first voltage terminal provides a first supply voltage smaller than a second supply voltage provided by the second voltage terminal.

4. The integrated circuit of claim 3, wherein a second region of the plurality of third active regions is configured to receive the second supply voltage in an ESD event when the electrostatic charges are discharged to the first voltage terminal by the plurality of first active regions and the plurality of second active regions.

5. The integrated circuit of claim 1, further comprising:
a plurality of third active regions, of a second conductivity type different from the first conductivity type, that are coupled between the pad and a second voltage terminal and arranged in a well of the first conductivity type, wherein a first region in the plurality of third active regions, coupled to the first regions in the plurality of first active regions and in the plurality of second active regions, has a width smaller than the widths of the first regions in the plurality of first active regions and in the plurality of second active regions, wherein the plurality of first active regions and the plurality of second active regions are disposed on a substrate.

6. The integrated circuit of claim 1, wherein the plurality of first active regions are disposed in a well of the first conductivity type in a substrate, and
the plurality of second active regions are disposed on the substrate.

7. The integrated circuit of claim 1, wherein the first region and a second region, that are in the plurality of first active regions, are included in a first transistor, and
third to fourth regions in the plurality of first active regions are included in a second transistor coupled in series with the first transistor, wherein the second to third regions in the plurality of first active regions are coupled with each other and separated from each other by a portion of a substrate in a layout view.

8. An integrated circuit, comprising:
a resistive device coupled between a pad and a first voltage terminal providing a first supply voltage, and configured to operate with the first supply voltage during an electrostatic discharge (ESD) event; and
a first transistor and a second transistor that are coupled in parallel between the pad and a second voltage terminal, wherein the second voltage terminal provides a second supply voltage different from the first supply voltage, wherein the first transistor is configured to clamp a voltage across the pad and the second voltage terminal in the ESD event when the second transistor is turned off, and the first transistor is further configured to discharge an ESD current to the second voltage terminal, wherein the second transistor is configured to be turned on when the voltage reaches a trigger voltage of the second transistor and to discharge the ESD current to the second voltage terminal.

9. The integrated circuit of claim 8, wherein the first transistor comprises first and second active regions and the second transistor comprises third and fourth active regions, wherein the first and third active regions are coupled together to the pad and have a first width, and the second and fourth active regions are coupled to the second voltage terminal and have a second width different from the first width.

10. The integrated circuit of claim 9, wherein the first width is greater than the second width.

11. The integrated circuit of claim 8, further comprising:
a plurality of third transistors coupled between first transistor and the second voltage terminal, wherein the first transistor has a first breakdown voltage, and each of the plurality of third transistors has a second breakdown voltage smaller than the first breakdown voltage.

12. The integrated circuit of claim 11, wherein the first and second transistors and the plurality of third transistors are of N type.

13. The integrated circuit of claim 8, wherein the resistive device comprises a first active region of a first conductivity type, the first transistor comprises a second active region of a second conductivity type different from the first conductivity type, and the second transistor comprises a third active region of the second conductivity type, wherein the first to third active regions are coupled together to the pad, wherein a width of the first active region is smaller than a width of the second active region or the width of the third active region.

14. A circuit, comprising:
a first transistor having a first breakdown voltage and comprising:
a first active region that has a first conductivity type and a first width and is coupled to a pad; and
a second active region that has the first conductivity type and a second width different from the first width and is coupled between the first active region and a first voltage terminal, wherein the first and second active regions are configured to discharge electrostatic charges from the pad to the first voltage terminal; and an ESD primary circuit coupled between the first active region and the first voltage terminal, wherein the ESD primary circuit has a trigger voltage lower than the first breakdown voltage.

15. The circuit of claim 14, wherein the first width is around 5 to around 6 times greater than the second width.

16. The circuit of claim 14, further comprising:
a plurality of third active regions that are coupled between the second active region and the first voltage terminal and are configured to discharge the electrostatic charges from the pad, wherein the plurality of third active regions have the first conductivity type.

17. The circuit of claim 16, wherein the first width is greater than a width of each of the plurality of third active regions.

18. The circuit of claim 16, further comprising:
a plurality of fourth active regions that are coupled between the pad and a second voltage terminal and are configured to discharge the electrostatic charges from the pad to the second voltage terminal, wherein the plurality of fourth active regions have a second conductivity type different from the first conductivity type.

19. The circuit of claim 18, wherein the first width is greater than a width of each of the plurality of fourth active regions.

20. The integrated circuit of claim 1, wherein the first conductive type is N type.

* * * * *